United States Patent [19]

Davis et al.

[11] Patent Number: 4,620,762
[45] Date of Patent: Nov. 4, 1986

[54] ELECTRONIC KEY ASSEMBLIES

[75] Inventors: Wayne S. Davis, Harrisburg; George R. Defibaugh, Camp Hill; Jon A. Fortuna, New Cumberland, all of Pa.

[73] Assignee: AMP Incorporated, Harrisburg, Pa.

[21] Appl. No.: 761,344

[22] Filed: Jul. 31, 1985

Related U.S. Application Data

[63] Continuation of Ser. No. 669,554, Nov. 8, 1984, abandoned, which is a continuation-in-part of Ser. No. 661,498, Oct. 16, 1984, abandoned.

[51] Int. Cl.$^4$ .......................................... H01R 13/648
[52] U.S. Cl. ............................... 339/91 R; 339/14 R; 339/143 R; 339/147 P; 339/206 R
[58] Field of Search ............ 339/91 R, 147 R, 147 P, 339/143 R, 14 R, 136 R, 136 M, 206 R, 213 R

[56] References Cited

U.S. PATENT DOCUMENTS

| | | | |
|---|---|---|---|
| 4,206,962 | 6/1980 | Shue, Jr. et al. | 339/147 R |
| 4,274,698 | 6/1981 | Ahroni | 339/147 P |
| 4,337,989 | 7/1982 | Asick et al. | 339/143 R |
| 4,406,509 | 9/1983 | Jagen | 339/91 R |
| 4,457,575 | 7/1984 | Davis et al. | 339/176 MP |
| 4,489,997 | 12/1984 | Byrne | 339/14 R |

*Primary Examiner*—John McQuade
*Attorney, Agent, or Firm*—Robert W. J. Usher

[57] ABSTRACT

An electronic key assembly (10) comprising an insulating plug body (11) having a front mating end (17) for receipt in a jack and a rearwardly spaced, chip carrier receiving cavity (19). A series of contacts (12) having first contact portions (34) are mounted in body recesses (32) at the mating end for engagement with spring contacts of a complementary jack and second spring contact portions (36) which extend into the cavity (19) are for engagement with respective leads of a chip carrier (15) received therein. Releasable latch arms (41) extend rearwardly from the mating end (17) and a sleeve-form shield (12) moulded in the fingerpiece (14) is received on the body (11) to surround a rear end and the chip carrier (15). Anit-overstress arms (64) extending from the fingerpiece (14) hook over the latch arms (41) to prevent excessive movement of the latch arms (41) away from the body (11). The shield (192) includes a window (194) having a rim (195) surrounding the first contact portions (180) and the fingerpiece (210) includes a tongue (213) which extends forwardly within the shield (192) to a location adjacent the first contact portions partly to close the window (194).

7 Claims, 17 Drawing Figures

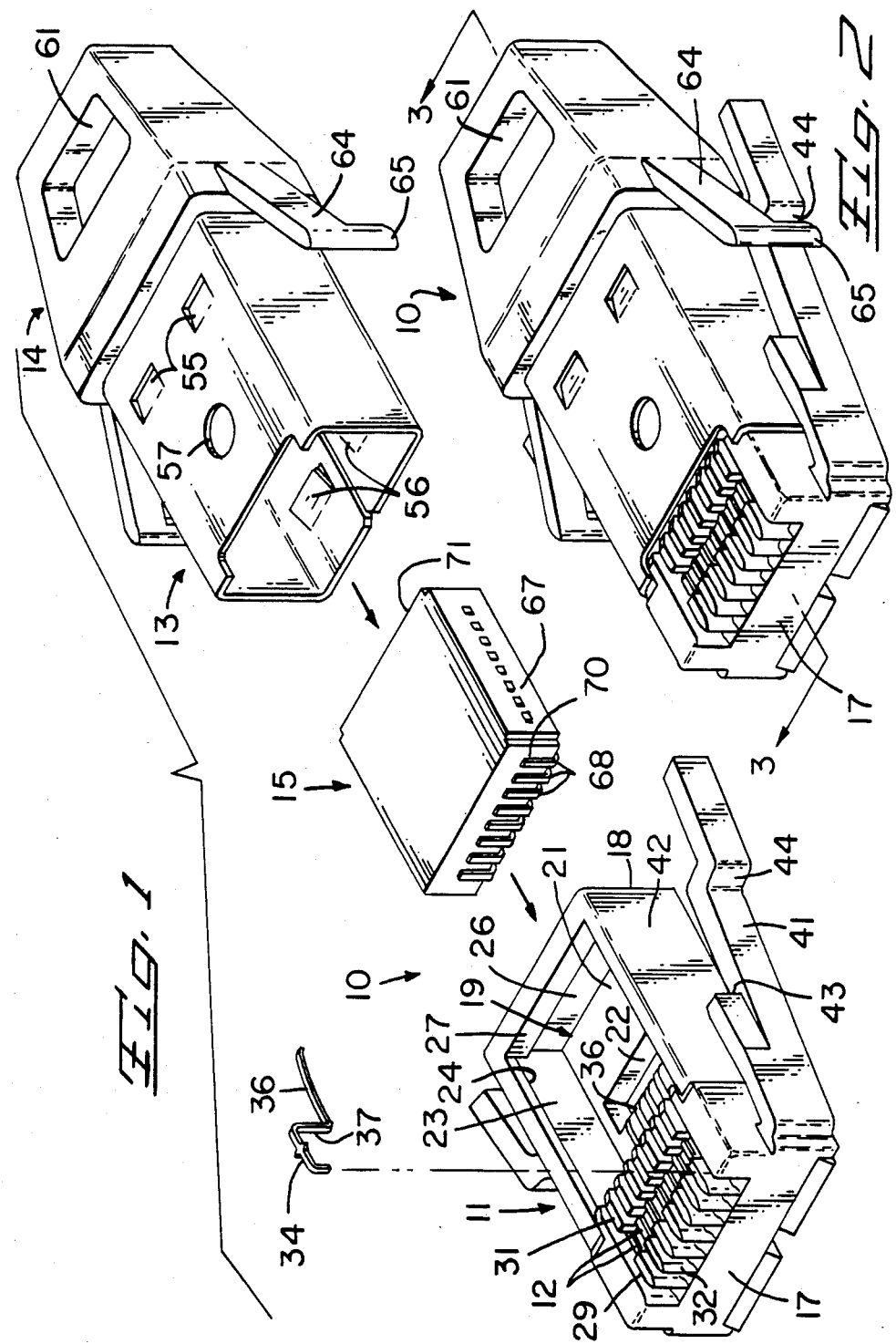

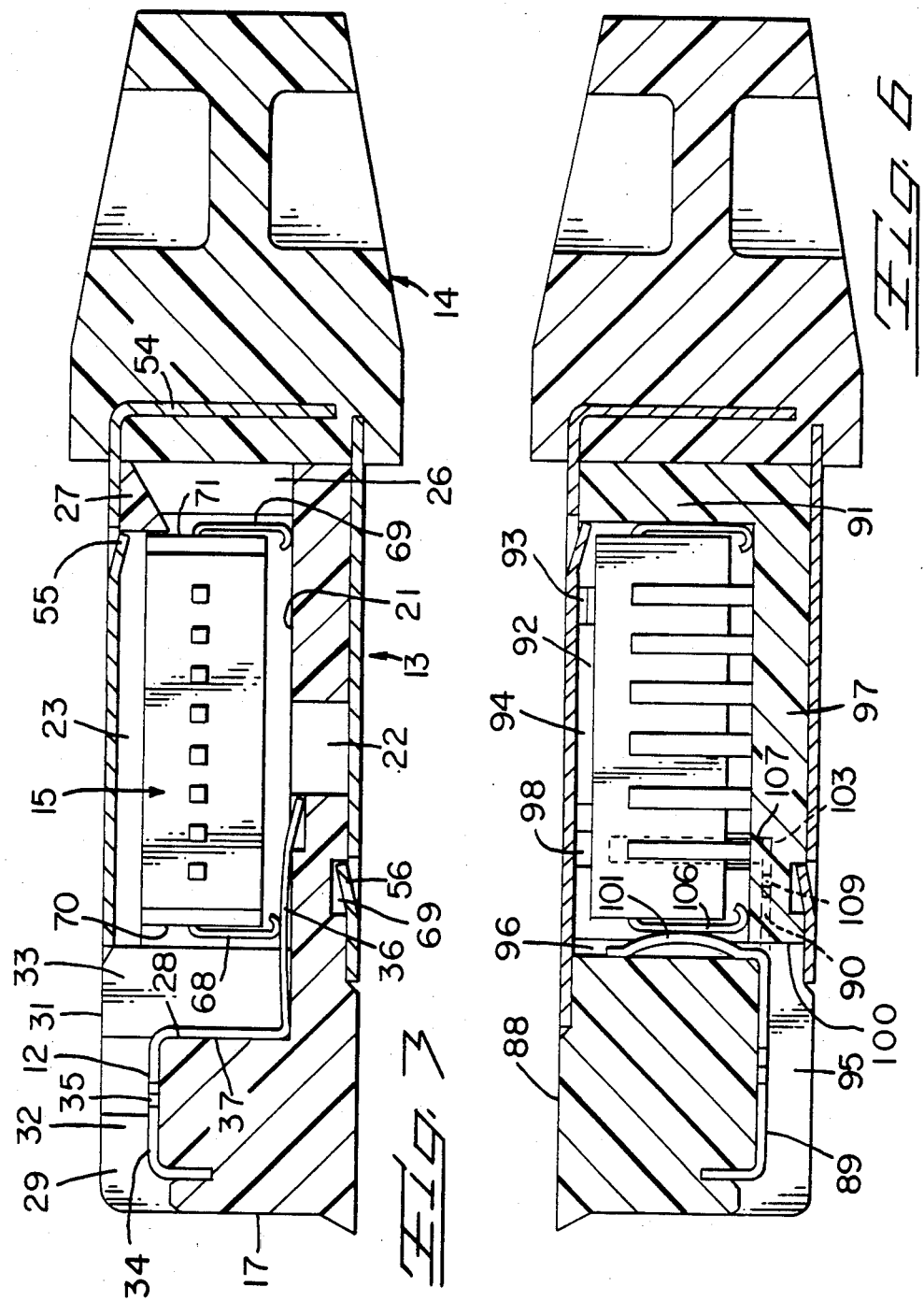

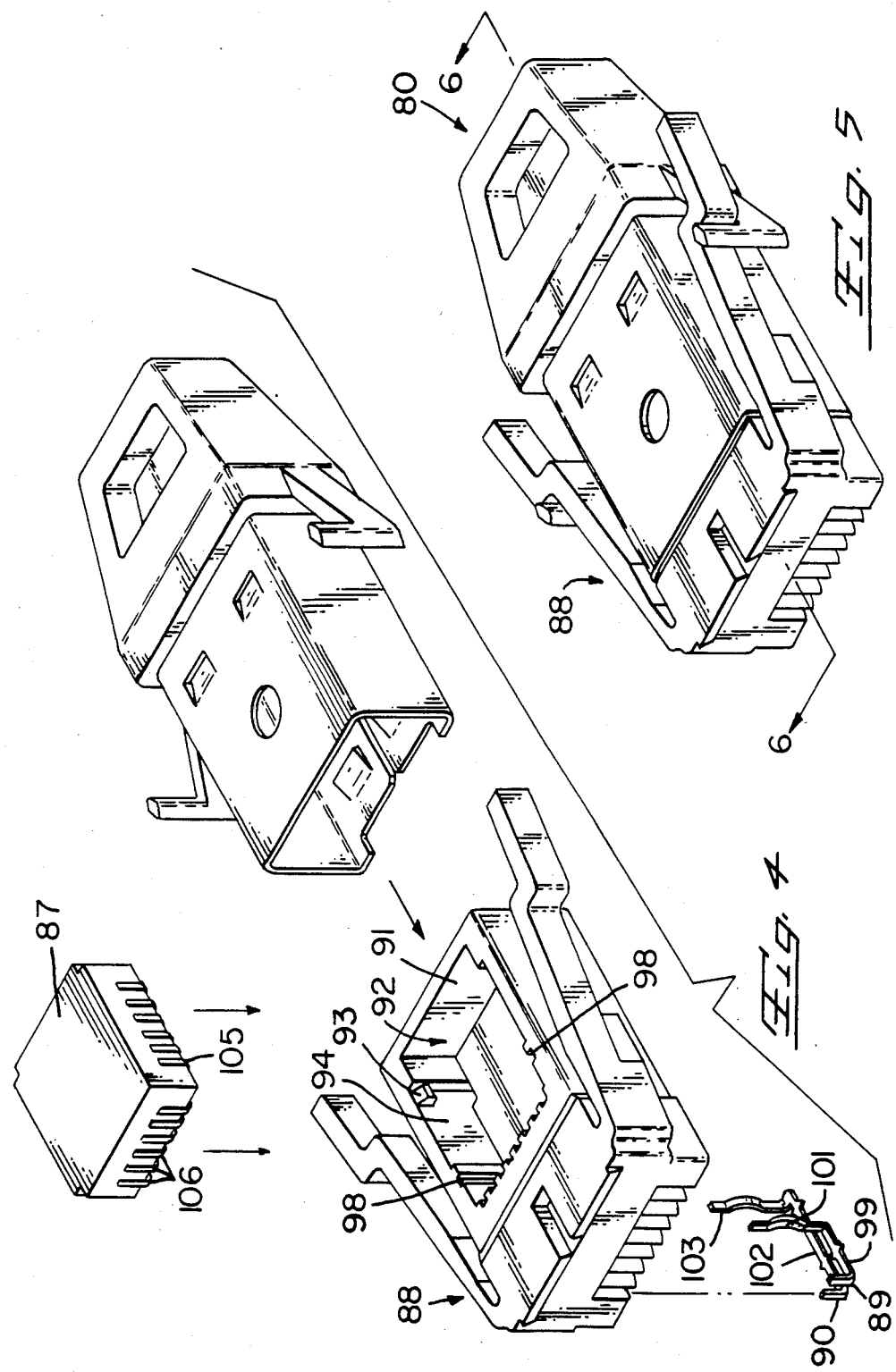

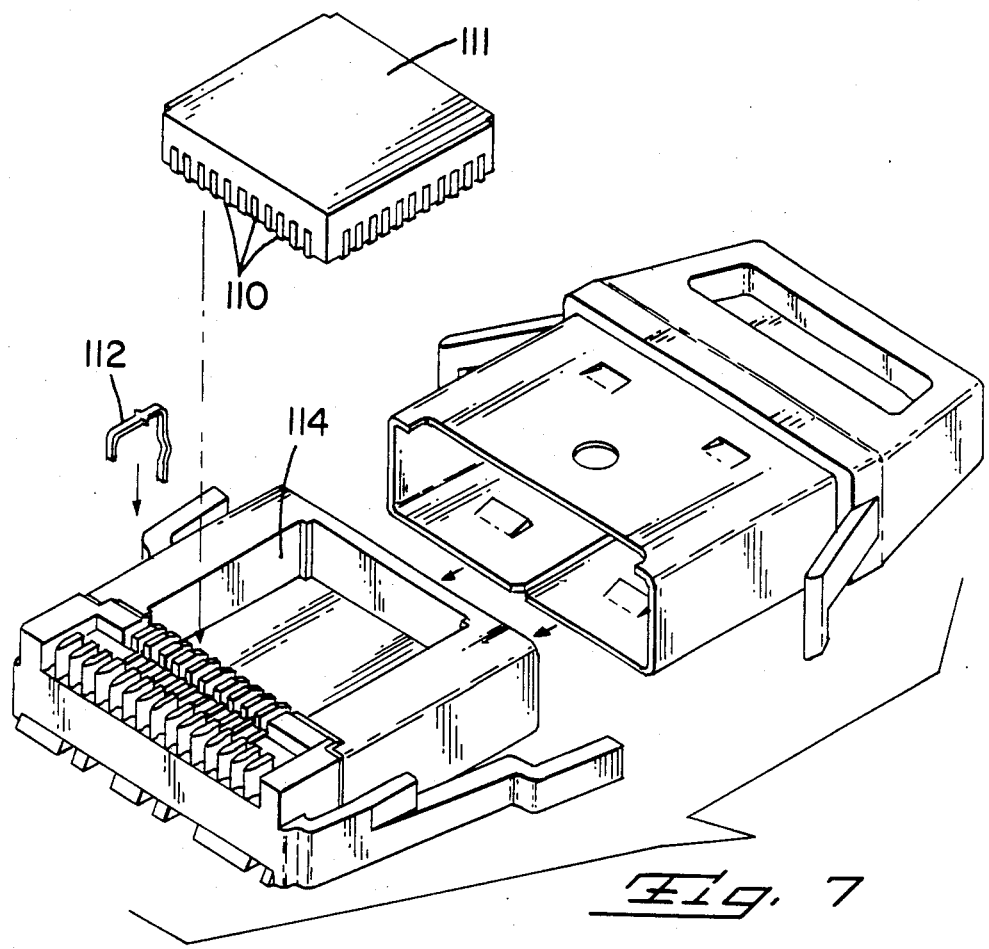
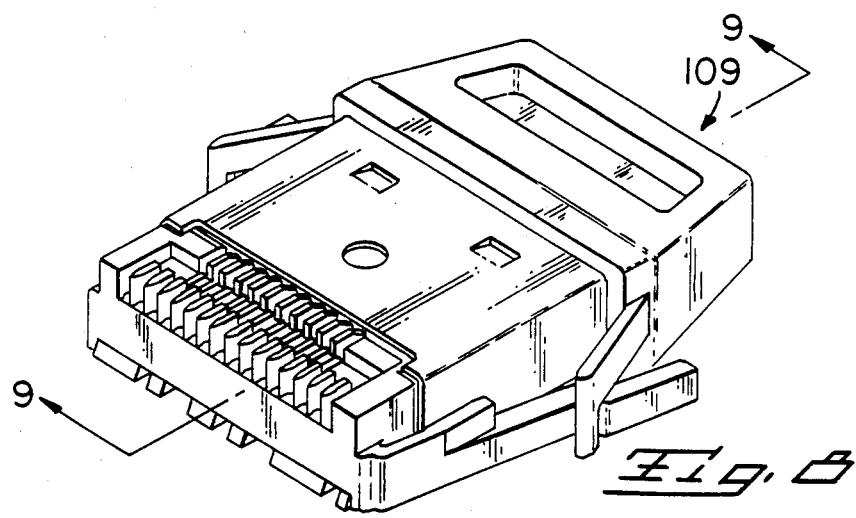

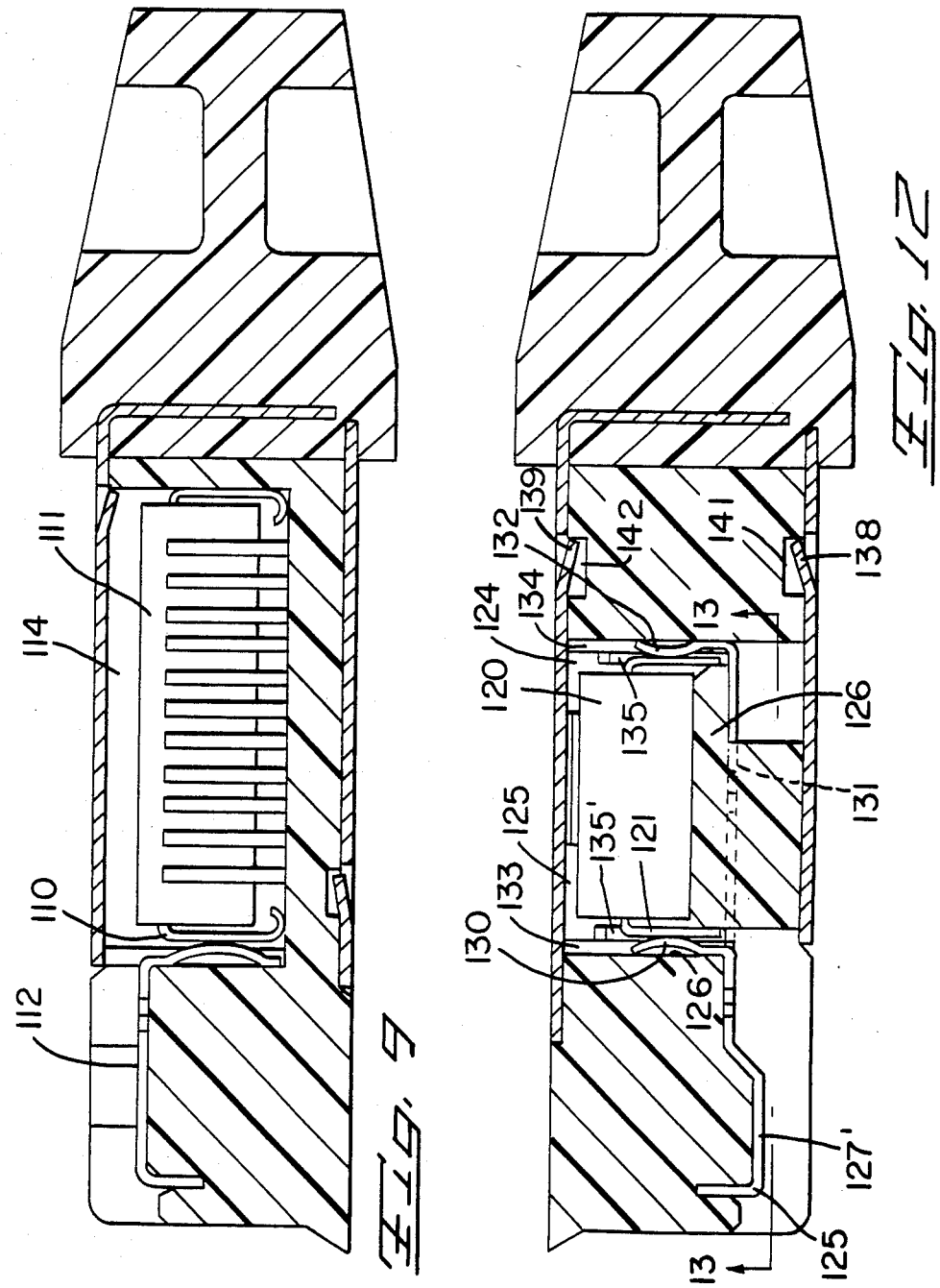

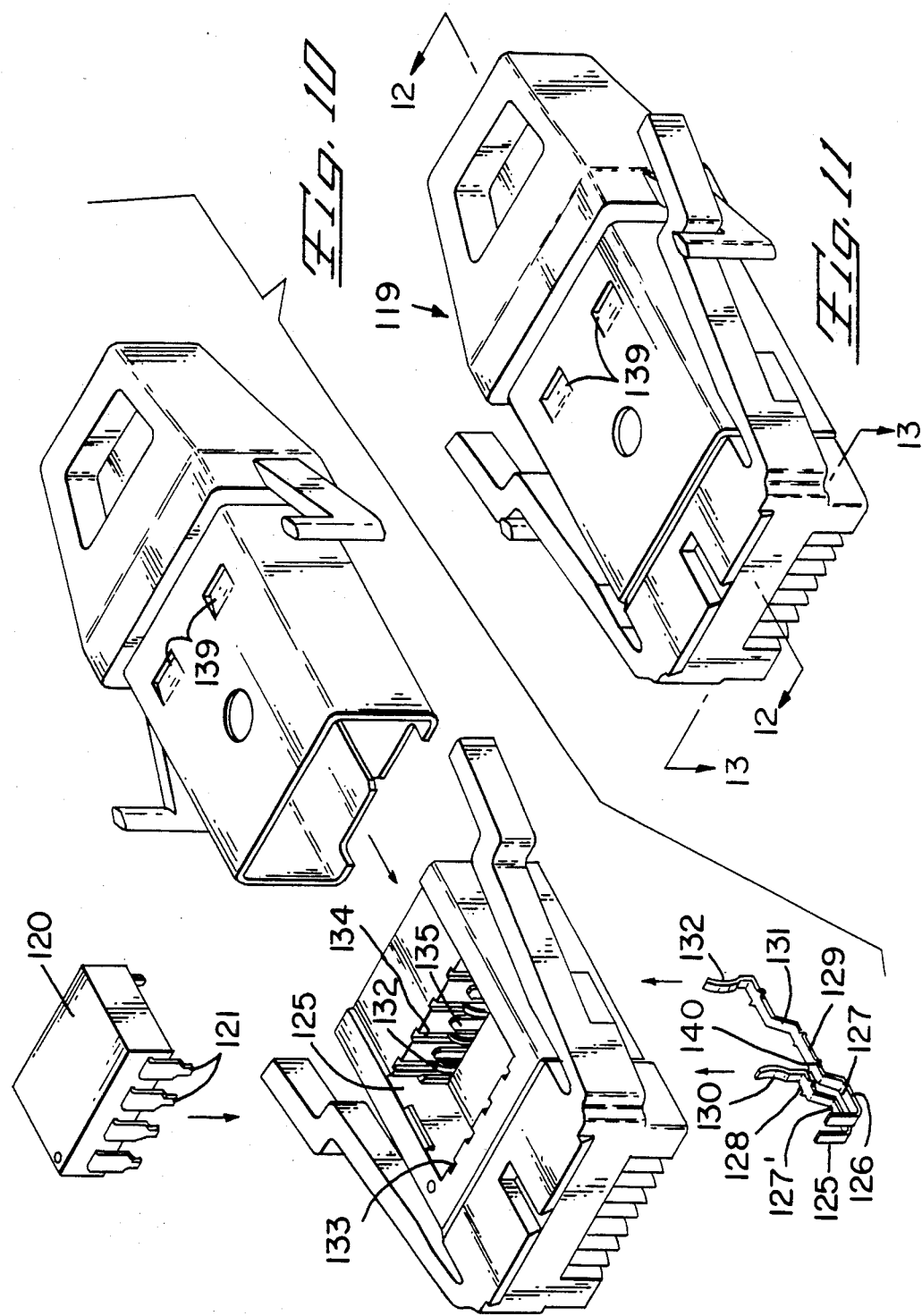

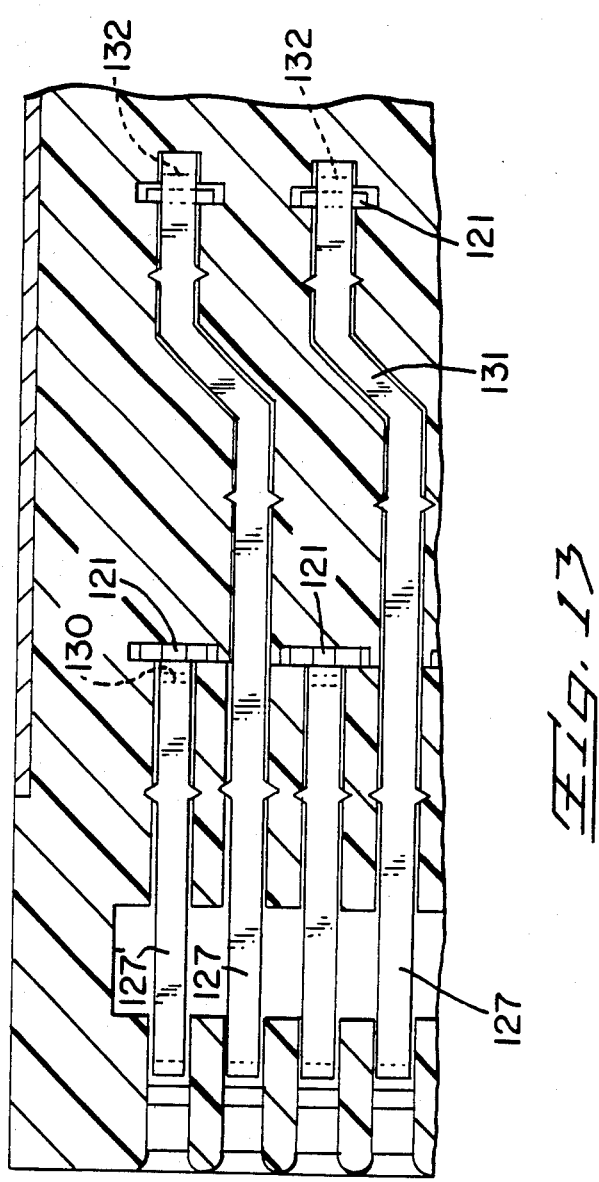

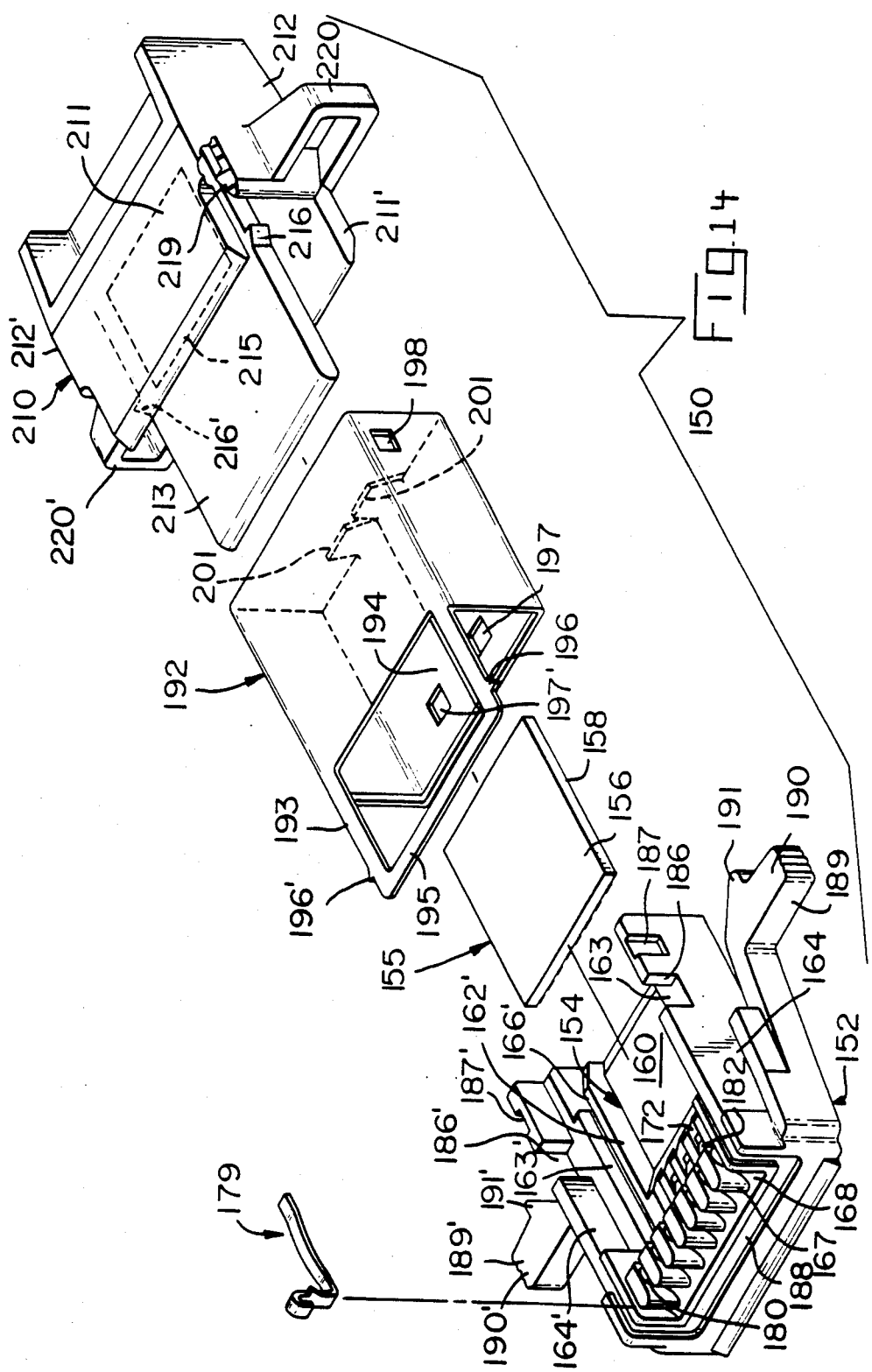

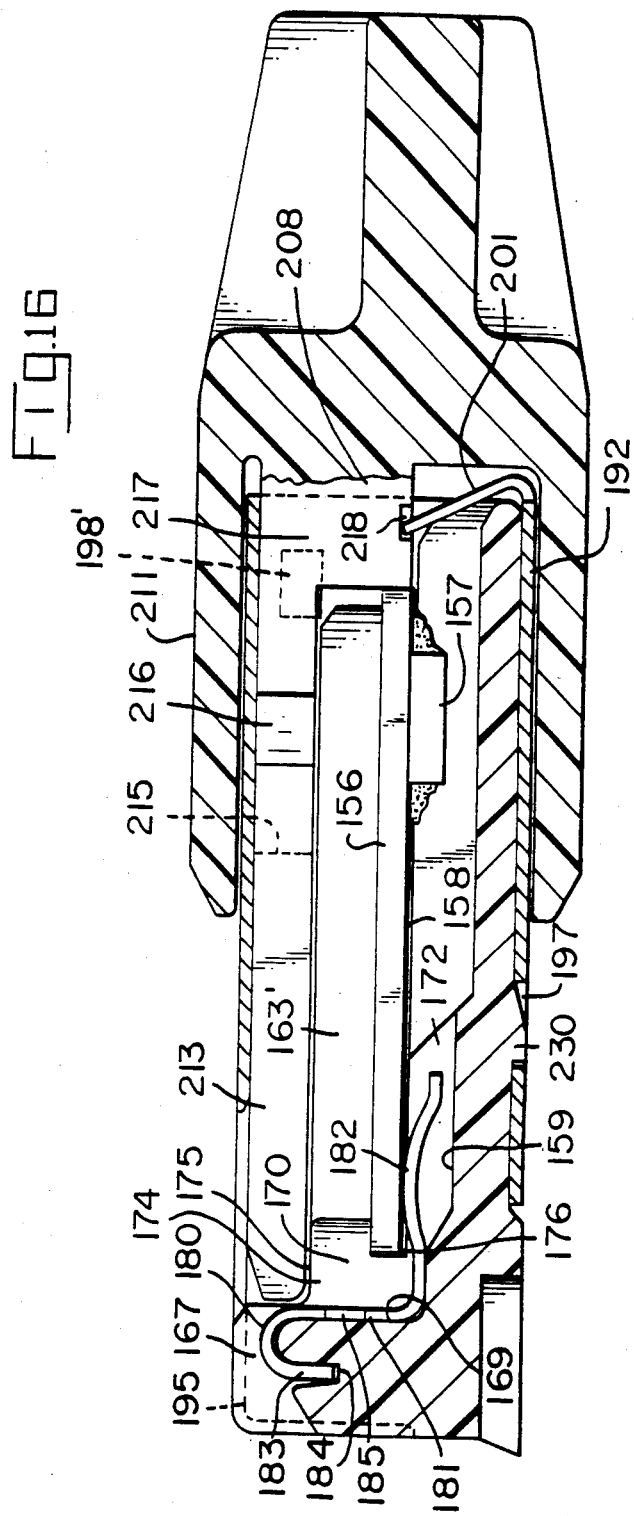

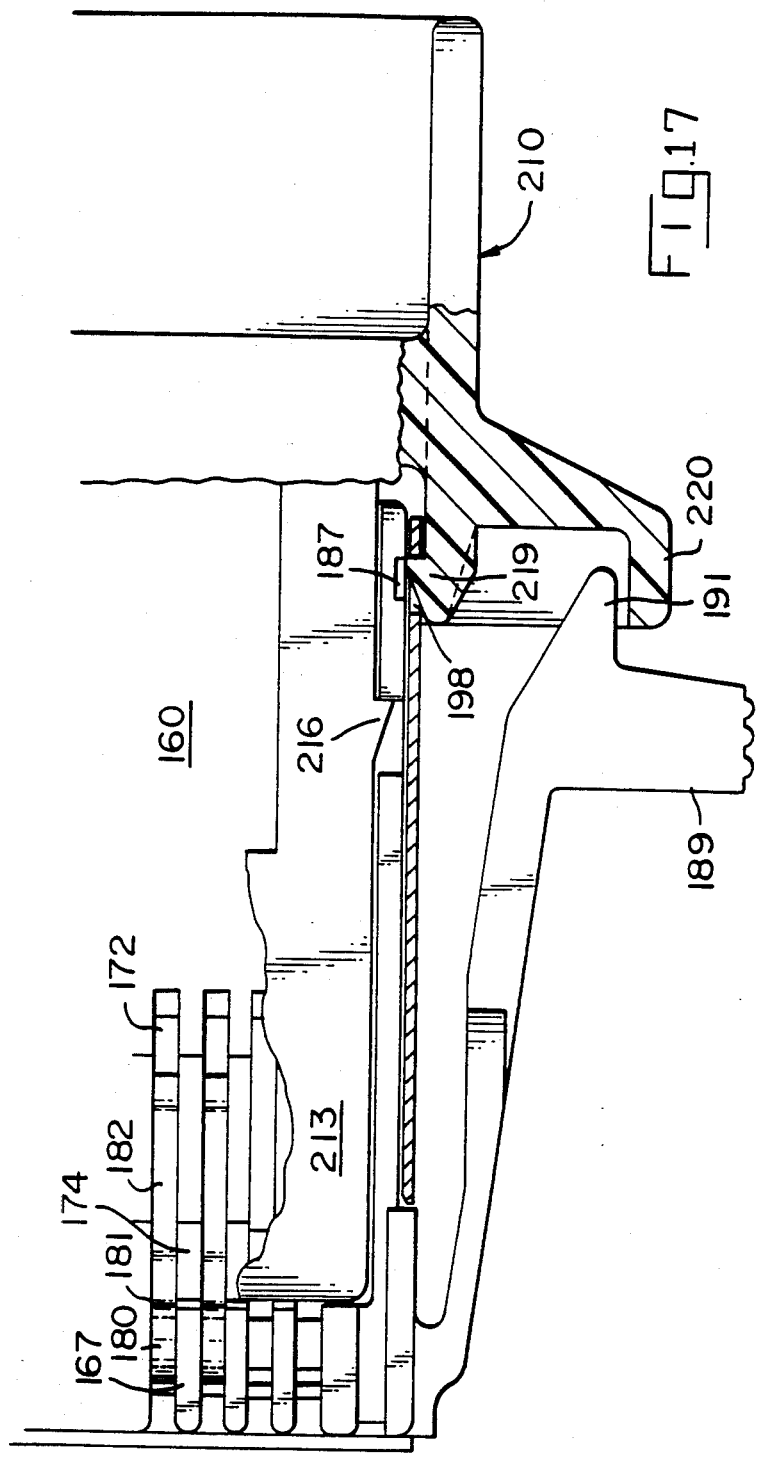

ELECTRONIC KEY ASSEMBLIES

The present application is a continuation of U.S. patent application Ser. No. 669,554 filed Nov. 8, 1984, now abandoned, which is a continuation-in-part application of U.S. patent application Ser. No. 661,498 filed on Oct. 16, 1984, now abandoned.

The invention relates to electronic key assemblies.

In order to prevent unauthorized entry or use of a facility such as a computer program, it has been proposed to require the use of an electronic key in the form of a preprogrammed microcircuit chip to gain access to the facility.

In one particular application, concerning computer software, the electronic key would be supplied to an authorized user with the disc or tape carrying the program. Use of the program would then only be possible when a compatible signal had been received from the key connected to the terminal.

It is clearly desirable that the key can be readily manipulated by the user, is significantly rugged to withstand handling abuse, easily connected and disconnected from the equipment.

An electrical socket connector incorporating an integrated circuit is disclosed in U.S. Pat. No. 4,206,962. However, the connector is not compatible with standard modular jacks commonly used in the data industries. The integrated circuit is relatively insecure and electrically unshielded.

An example of such modular jacks (and compatible plugs) is disclosed in U.S. Pat. No. 4,457,575.

In the standard jacks, a row of spring contacts extend from one side of a mating face, rearwardly, cantilever fashion, across a plug receiving socket, obliquely of the mating axis. Compatible plugs each include a row of contacts extending across one side of an insulating plug body at a mating end for engagement with respective socket contacts on insertion of the plug into the socket.

In addition, the key should be capable of economic manufacture, desirably using standard chip carriers permitting surface mounting with minimal modification.

According to one aspect of the invention, the key comprises an insulating plug body moulded from plastics material having a front mating end for receipt in a jack and a rear end, and formed with a chip carrier receiving cavity spaced rearwardly from the mating end; a row of contact receiving recesses extending rearwardly from the mating end along a side of the body towards the cavity; a series of contacts having first contact portions mounted in the recesses for engagement with spring contacts of a complementary jack and second, spring contact portions extending into the cavity for engagement with respective leads of a chip carrier received in the cavity; releasable latch arm means extending rearwardly from the mating end; and, a sleeve-form shield receivable on the body surrounding the rear end and extending forwardly over the cavity towards the mating end thereby completely to enclose and shield the chip carrier in the cavity.

Preferably, the shield is anchored in a fingerpiece at one axial end, to facilitate handling. To enable the key to be carried by the user and consequential rough handling, anti-overstress means extends forwardly from the fingerpiece trapping the latch arm to prevent excessive movement thereof away from the body.

More particularly, the latch arm is formed with a forwardly facing shoulder adjacent its rear end and the overstress means comprises a rearwardly facing hook engaging the shoulder.

Conveniently, the latch arm is stepped outwardly towards its free end to provide the shoulder.

In one example, the fingerpiece is moulded from plastics material with the overstress means integral therewith, the shield being inmoulded with the fingerpiece.

In one preferred form, the shield includes a forwardly extending flap formed with a window, a rim of which window is deformable to extend along the side of the body and along the mating end surrounding the first contact portions of the series of contacts so that they are in registration with the window. This assists in preventing damage from electrostatic charge carried by any objects adjacent the first contact portions.

The wall of the shield may be spaced apart rearwardly of the first contact portions, a rear end of the shield being anchorable in a fingerpiece which includes a tongue which extends forwardly through the sleeve over the cavity to a location adjacent the recesses receiving the first contact portions to bridge the space between the shield wall and the recesses thereby completely to close the cavity. The anti-overstress means may comprise an eye on the fingerpiece receiving a rearwardly extending projection on a rear free end of the latching means.

The chip carrier may be constituted by a printed circuit board received in grooves extending along opposite side walls of the cavity from an open rear and the fingerpiece may include a stop engaging the rear of the printed circuit board in the assembled condition of the key to retain the printed circuit board accurately located in the grooves.

This provides a rugged and compact key assembly which incorporates a standard chip carrier with minimal modification, is economical to manufacture by mass production techniques, and which is also compatible with existing standard modular jack structures.

Examples of key assemblies according to the invention will now be described with reference to the accompanying drawings in which:

FIG. 1 is an exploded isometric view of a first example of a key assembly according to the invention;

FIG. 2 is an isometric view of the assembly of FIG. 1;

FIG. 3 is a cross-sectional view of the assembly taken along line 3—3 of FIG. 2;

FIG. 4 is an exploded isometric view of a second example of a key assembly according to the invention;

FIG. 5 is an isometric view of the assembly of FIG. 4;

FIG. 6 is a cross-sectional view of the assembly taken along line 6—6 of FIG. 5;

FIG. 7 is an exploded isometric view of a third example of a key assembly according to the invention;

FIG. 8 is an isometric view of the assembly of FIG. 7;

FIG. 9 is a cross-sectional view of the assembly taken along line 9—9 of FIG. 8;

FIG. 10 is an exploded isometric view of a fourth example of a key assembly according to the invention;

FIG. 11 is an isometric view of the assembly of FIG. 10;

FIG. 12 is a cross-sectional view of the assembly taken along line 12—12 of FIG. 11;

FIG. 13 is a fragmentary cross-sectional view along line 13—13 of FIG. 10 of the fourth example showing the contact layout;

FIG. 14 is an exploded isometric view of a fifth example of key assembly according to the invention;

FIG. 16 is a cross-sectional view taken along line 16—16 of FIG. 15; and,

FIG. 17 is a fragmentary plan view of the assembly of FIG. 14 partly in cross section.

Figure 15:
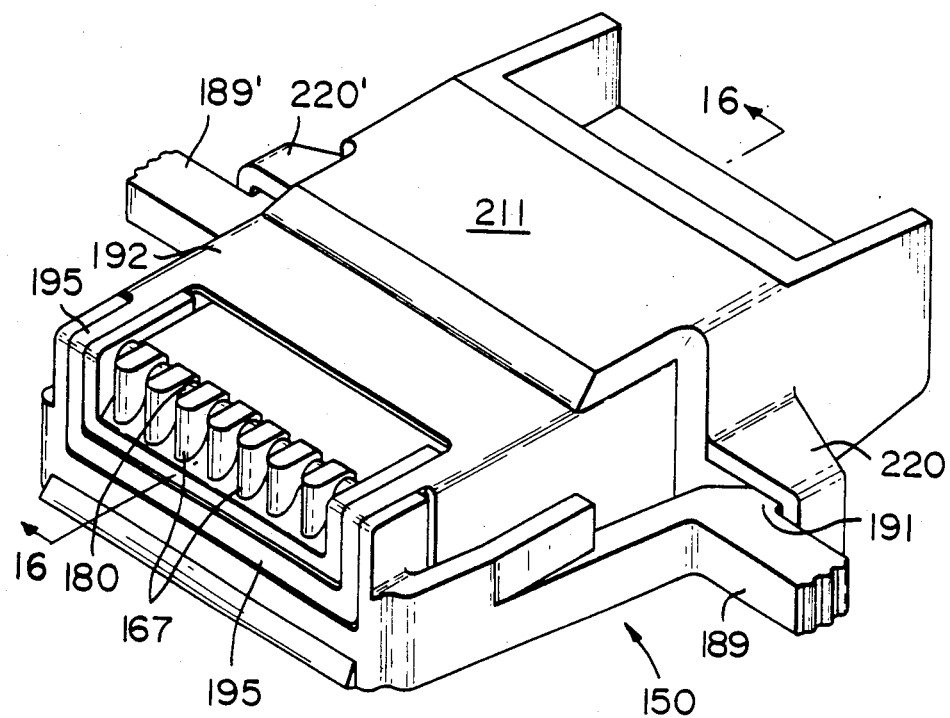
FIG. 15 is an isometric view of the assembly of FIG. 14.

In the first example, shown in FIGS. 1 to 3, the key assembly 10 comprises an insulating plug body 11, housing a series of contacts 12, a sleeve-form shield 13 inmoulded in a plastics fingerpiece 14 and a chip carrier 15 incorporating a programmed chip (not shown).

The external profile of the plug body 11 is similar to that described in U.S. Pat. No. 4,457,575 and is adapted to mate with a suitable conventional jack. Briefly described, the plug body 11 has a front mating end 17 and a rear end 18. A chip carrier receiving cavity 19 is formed adjacent the rear end 18 spaced from the mating face and comprises a base 21 with a transverse aperture 22, opposed side walls 23 upstanding from the base 21 and having an overhanging upper edge 24. The cavity is provided with a chip carrier admitting opening 26 at the rear across which extends a latching detent 27 integral with the upper edges 24 of the side walls 23. Two spaced rows of spaced barrier walls 29 and 31 outstand respectively from a depression in a side of the body between the mating end 17 and the cavity 19 and the front wall 28 of the cavity defining between them contact receiving recesses 32, 33 extending rearwardly from the mating end towards the cavity and down the cavity wall 28 to the base 21.

Stamped and formed metal contacts 12 each have a first contact portion 34 anchored in the depression by barbs 35, a body portion 37 extending along the front wall 28 of the cavity between barriers 31, and a second contact portion 36 extending across the cavity base 21 in parallel, spaced apart relation and bowed upwardly to constitute a beam spring portion, anchored at free ends by tangs in recesses adjacent aperture 22.

Latch arms 41 extend rearwardly from root ends integral with opposite sides 42 of the body at the front end 17 and are formed with rearwardly facing latching shoulders 43 at intermediate locations. The arms are stepped outwardly of the plug body adjacent their rear, free, ends to provide forwardly facing shoulders 44 for cooperation with anti-overstress means described below.

The shield 13 is stamped and formed from sheet metal stock as an open-seamed rectangular-section tube with a flap 54 closing one end which is inmoulded in the plastics fingerpiece 14. The shield is formed with latching detents 55 and 56 on upper and lower sides. An aperture 57, to admit potting material, is formed in the upper side.

The fingerpiece 14 is of rearwardly tapering cross section and includes finger receiving recesses 61 on upper and lower faces. Extending forwardly in divergent fashion from opposite sides are anti-overstress cantilever arms 64 having hooked ends 65.

The chip carrier 15 is of standard type having leads removed from opposite side faces 67 to facilitate receipt in the cavity, leaving a row of eight leads 68 and 68' on front and rear faces 70 and 71.

To assemble the key, the chip carrier 15 is inserted through the rear opening 26 into the cavity by resilient flexure of the detent 27 so that the chip carrier is trapped by the detent 27 and the overhanging upper edges. The leads 68 wipe across respective second contact portions 36 during insertion with flexure of both to establish connection therebetween.

The shield carrying the fingerpiece is then slid over the rear of the plug body with the chamfered hooked portions 65 initially camming the free ends of the latch arms 41 inwardly and ultimately snapping behind the shoulders 44. The detents 55 and 56 snap into recesses 69 on the underside of the plug body and behind detent 27, respectively, to latch the shield permanently onto the body. Potting material can then be injected through opening 57, if desired.

A rugged and compact structure is thus formed by mass production techniques. Overstress of the latch arms 41 away from the body is prevented by the anti-overstress arms 64 enabling the key assembly to be freely handled and carried by the user.

A minimum of modification, both of the conventional plug design and chip carrier, is needed and the plug is compatible with conventional jacks being readily plugged and unplugged from the computer terminal.

A further advantage of the particular contact construction is that a smooth, unsheared surface of the contact portions engages the jack contacts rather than the rough sheared edge of conventional wire connecting contacts. This enhances contact life and the reliability of the electrical connection.

The aperture 22 is provided to admit a shear blade to sever the contacts from a carrier strip after receipt in the housing.

In the second, third and fourth examples of key assemblies 80, 109 and 119, respectively, the shield and fingerpiece are substantially identical to that of the first example. Similarly, the external profile of the plug body is substantially identical to that of the first example except in relation to dimensions and coding features. Other features of difference which adapt the plug to accommodate different chip carrier structures are described below.

In the second example, shown in inverted position in FIGS. 4 to 6, the plug body 88 and contacts 89 and 90 are designed to provide an eight line connection to a standard twenty-four line chip carrier 87. In this example, the rear wall 91 of the cavity 92 is imperforate, the base being open to admit the chip carrier, latching detents 93 being provided on side walls 94 to retain the chip carrier in position. A series of spaced barriers 95 extend rearwardly and continuously from the front end along one side and down a front wall 96 of the cavity. The top of the cavity is closed by a wall 97 and contact admitting passageways 100 are provided for second contact portions of contacts 89 entering the cavity. A pair of grooves 98 extend vertically along opposite side walls adjacent the front wall.

The six central contacts 89 are identical, with first contact portions 99 located between barriers 95 and second contact portions 101 extending through passageways 100 down along the front wall bowed away from the wall to form beam springs. The outer two contacts 90 have longer first contact portions that extend into grooves in wall 97 then through 90 degrees through passageways 107 to extend downwardly at the junction of side and top walls 94 and 97 so that second contact portions 103 extend along the grooves 98 in the side wall forming similar beam springs, but aligned with leads 105. Barbs such as indicated at 109 assist in retaining the contacts in the housing.

This enables the chip carrier to be press-fitted into the cavity through the open base with contact portions 101 connecting to the row of six leads 106 on one face of the carrier and contact portions 103 connecting to the one adjacent lead 105 on each adjacent face.

In the third example 109 of the invention, eight lines of connection are formed by connection with eight preselected leads 110 of a standard forty-four lead chip carrier 111 using contacts 112 identical to each other and similar to the contacts 89 of the second example. The cavity 114 has a top chip carrier admitting opening and an imperforate base, side and end walls.

In the fourth example 119, shown in inverted position in FIGS. 10-12, the chip carrier has the form of a dual-in-line package 120 with four leads 121 on each of a pair of opposite faces. The cavity 124 is formed with a chip carrier admitting opening 125 at the base and a top wall 126 spaced in part from the top side of the plug. Four, spaced apart, contact receiving passageways 133, 134 extend through the top wall 126 adjacent a front and rear wall of the cavity communicating with the cavity and the space, opening to form grooves extending along the front and rear cavity walls. Between the grooves extend lead guiding ribs 135, 135' which both assist in isolating adjacent contacts received in the grooves and the adjacent chip carrier leads 121 and assist in guiding the leads into the grooves.

The two sets of contacts 125, 126 are of different lengths for receipt in the forward and rearward grooves 133 and 134, respectively. The sets have identical first contact portions 127, 127' but the body portions 128 of contacts 125 are relatively short so that their second, bowed, contact portions 130 extend through passageways 133 and are received in the grooves on the front wall of the cavity. The body portions 129 of contacts 126 are relatively long and stepped across at 131 so that second, bowed, contact portions 132 are received as beam spring 138 in grooves 134 opposite first contact portions 130. Barbs 140 are provided at various positions along the contacts to retain them as an interference fit in the grooves.

In this example, the shield latching detents 138, 139 are received in recesses 141, 142 on upper and lower sides of the plug body adjacent the rear.

In the fifth example of key assembly shown in FIGS. 14 to 17, the plug body 152 is formed with a chip carrier receiving cavity 154 adapted to receive a chip carrier 155 constituted by a printed circuit board 156 having a chip 157 mounted on one face 158 (FIG. 16). The cavity 151 is open to the plug rear and a base 154 of the cavity is formed with a central chip receiving pocket 160 the opposite rims 162' of which cooperate with overlying ribs 163, 163' extending from side walls 164, 164' to define printed circuit board receiving grooves 166' extending forwardly from the open rear.

A row of barrier walls 167 outstand from a depression 168 in a side of the body and extend rearwardly down a front wall 169 of the cavity 154 to define between them contact receiving recesses 170 which communicate rearwardly with contact receiving grooves 172 in the base 159. Portions 174 of the barrier walls which extend down the front wall are stepped down to provide shoulders 175 and are cut away adjacent the bases to provide board admitting openings 176.

The recesses receive contacts 179 each stamped and formed with hooked first contact portions 180 joined by body portion 181 to cantilever spring second contact portions 182. Leading ends 183 of the hooked contact portions 180 are located in wells 184 formed in the recesses adjacent the mating face; the body portions are anchored by barbs 185 which engage adjacent barriers and the second contact portions extend into the grooves 172. A shield receiving groove 188 extends along the front face surrounding the contact and barrier rows and rearwardly partway along an upper edge of the side walls, the base of the groove being coplanar therewith.

Fingerpiece latching notches 186, 186' extend through respective side walls 164, 164' at locations towards the rear end and outwardly facing latching recesses 187, 187' are formed in the side walls between the latching notches and the free end. The latching arms 189, 189' have outwardly projecting fingerpieces 190, 190' at free ends and rearwardly projecting latches 191, 191'.

The shield 192 is modified in that one side is provided with a forwardly extending flap 193 formed with a window 194 from opposite sides of a rim 195 of which extend anchoring barbs 196, 196'. Latching apertures 197, 197', 198, 198' are formed adjacent a forward end in respective opposite sides of a seam and in opposite sides adjacent a rear end. Locking lances 201, 201' upstand from a side wall at the rear open end of the shield.

The fingerpiece 210 is moulded in one piece of plastics material and includes spaced apart upper and lower walls 211, 211' joined by opposed side walls 212, 212' and an end wall 208 forming a socket. A tongue 213 protrudes forwardly from the end wall 208 adjacent and spaced from the upper wall 211 and is formed with a stress relieving aperture 215 at a location between latching detents 216 on respective opposite edges. A stop 217 is formed at the junction of the tongue and the end wall. A latching recess 218 is formed in a lower surface of the stop 217. Catches 219 are formed on forward edges of the end walls and anti-overstress eyes 220, 220 extend from opposite side walls 212, 212'.

To assemble the key, the printed circuit board 156 carrying the chip 157 is slid along the grooves 166' until the conductive paths on the board engage the second contact portions 182 with resulting flexure thereof. The shield is then inserted rear first, into the fingerpiece socket with the upper wall received between the tongue 213 and the adjacent socket wall 211 and the catches 219 latching in apertures 198. The locking lances also snap into recesses 218 to assist in anchoring the shield in the fingerpiece. The subassembly of the fingerpiece and shield are then applied to the rear end of the plug body until the catches 216, 216' snap into notches 186, 186' and latching apertures 197, 197' receive latching ramps 230 formed on the undersurface of the plug body securing the assembly together. The catches 219 are also received in recesses 187. The stop 217 engages the printed circuit board and retains it firmly in position. The flap 193 is then deformed so that the rim 195 seats in the groove 188 at the front end. Resin may then be injected through apertures (not shown) in the rear of the fingerpiece.

Alternatively, where the assembly is to be supplied in only part assembled condition to permit subsequent insertion of the chip carrier the shield is preassembled onto the plug body and the flap deformed into place prior to receipt of the chip carrier and application of the fingerpiece.

Advantages associated with the fifth example are that the shield rim 195 will usually be closer than the contacts to external objects that could carry a high electrostatic charge. Thus, preferential discharge will occur onto the grounded shield protecting the chip from damage. Further protection from ingress of charged foreign objects adjacent the contacts is provided by the leading end of the tongue which substantially completely encloses the cavity when it seats on the shoulder 175 on the barriers 167 in the fully assembled condition of the key. This enables a greater clearance to be provided for the insertion of contact assembly tooling into the plug body adjacent the rear of the hooked first contact portion in the unassembled condition of the key. The key is thus readily manufactured and assembled using mass production techniques.

We claim:

1. An electronic key assembly comprising an insulating plug body moulded from plastics material having a front, mating end for receipt in a jack and a rear end and formed with a chip carrier receiving cavity spaced rearwardly from the mating end;
   a row of contact receiving recesses extending rearwardly from the mating end along a side of the body towards the cavity;
   a series of contacts having first contact portions mounted in the recesses for engagement with spring contacts of a complementary jack and second spring contact portions extending into the cavity for engagement with respective leads of a chip carrier received in the cavity;
   releasable latch arm means extending rearwardly from the mating end; and,
   a sleeve-form shield receivable on the body surrounding the rear end and extending forwardly over the cavity to the mating end thereby completely to enclose and shield the chip carrier in the cavity, the shield including a forwardly extending flap formed with a window, a rim of which window is deformable to extend along the side of the body and along the mating end surrounding the first contact portions of the series of contacts so that they are in registration with the window.

2. An electronic key assembly according to claim 1 in which a wall of the sleeve defining the window is spaced apart rearwardly of the first contact portions, a rear end of the shield being anchorable in a fingerpiece which includes a tongue which extends forwardly through the sleeve over the cavity to a location adjacent the recesses receiving the first contact portions to bridge the space between the sleeve wall and the recesses thereby completely to close the cavity.

3. An electronic key assembly comprising an insulating plug body moulded from plastics material having a front, mating end for receipt in a jack and a rear end and formed with a chip carrier receiving cavity spaced rearwardly from the mating end;
   a row of contact receiving recesses extending rearwardly from the mating end along a side of the body towards the cavity;
   a series of contacts having first contact portions mounted in the recesses for engagement with spring contacts of a complementary jack and second spring contact portions extending into the cavity for engagement with respective leads of a chip carrier received in the cavity;
   releasable latch arm means extending rearwardly from the mating end; and,
   a sleeve-form shield receivable on the body surrounding the rear end and extending forwardly over the cavity to the mating end thereby completely to enclose and shield the chip carrier in the cavity, the shield being anchored in a fingerpiece at one axial end, an anti-overstress eye extending from a side of the fingerpiece and the latch arm means having a rearwardly extending projection received in the eye which restricts the movement of the latch arm means away from the body.

4. An electronic key assembly, according to claim 2 for a chip carrier comprising a printed circuit board in which the cavity is open to a rear and a printed circuit board locating means, extends forwardly from the rear to guide the printed circuit board into the cavity and locate the printed circuit board in engagement with the second contact portions.

5. An electronic key assembly according to claim 4 in which the locating means comprises grooves in opposite side walls of the cavity, the fingerpiece being provided with a stop engaging the printed circuit board in the assembled condition to retain the printed circuit board in the cavity.

6. An electronic key assembly comprising an insulating plug body moulded from plastics material having a front, mating end for receipt in a jack and a rear end and formed with a chip carrier receiving cavity spaced rearwardly from the mating end;
   a row of contact receiving recesses extending rearwardly from the mating end along a side of the body towards the cavity;
   a series of contacts having first contact portions mounted in the recesses and exposed along the side of the body adjacent the mating end for engagement with spring contacts of a complementary jack and second spring contact portions extending into the cavity for engagement with respective leads of a chip carrier received in the cavity; and,
   releasable resilient latch arm means extending rearwardly from the mating end, the cavity being adapted to receive a chip carrier comprising a printed circuit board and being open to the rear and a printed circuit board locating means extending forwardly from the rear to receive and guide the printed circuit board into the cavity and locate the printed circuit board in engagement with the second contact portions.

7. An electronic key assembly according to claim 6 in which the locating means comprises grooves in opposite side walls of the cavity, a fingerpiece being provided with a stop engaging the printed circuit board in the assembled condition to retain the printed circuit board in the cavity.

* * * * *